United States Patent
Ying et al.

(10) Patent No.: US 6,781,385 B2
(45) Date of Patent: Aug. 24, 2004

(54) APPARATUS FOR DETECTING CURRENT DIRECTION IN BRIDGE CIRCUITS AND METHOD THEREOF

(75) Inventors: Jianping Ying, Neihu Taipei (TW); Jin Wang, Neihu Taipei (TW); Zhigan Wu, Neihu Taipei (TW)

(73) Assignee: Delta Electronics, Inc., Taoyuan (TW)

( * ) Notice: Subject to any disclaimer, the term of this patent is extended or adjusted under 35 U.S.C. 154(b) by 190 days.

(21) Appl. No.: 10/137,619

(22) Filed: May 2, 2002

(65) Prior Publication Data

US 2003/0206022 A1 Nov. 6, 2003

(51) Int. Cl.⁷ .......................... G01R 31/08; H02M 5/45; H02M 7/5387
(52) U.S. Cl. ...................... 324/526; 363/37; 363/132
(58) Field of Search .............................. 324/526, 525, 324/512, 500, 76.11, 76.39; 307/80, 81, 86, 413, 127, 138; 363/58, 37, 132; 361/18, 93.7

(56) References Cited

U.S. PATENT DOCUMENTS

| | | | | |
|---|---|---|---|---|
| 5,072,354 A | * | 12/1991 | Katto et al. ................. 363/41 |
| 5,949,663 A | * | 9/1999 | Endo et al. ................... 363/37 |
| 6,434,020 B1 | * | 8/2002 | Lambert et al. .............. 363/17 |
| 6,567,283 B2 | * | 5/2003 | Welches ....................... 363/89 |
| 6,570,780 B2 | * | 5/2003 | Furukawa et al. ............ 363/98 |
| 6,653,806 B1 | * | 11/2003 | Ono ........................... 318/375 |
| 6,678,180 B2 | * | 1/2004 | Matsuda ..................... 363/132 |

* cited by examiner

*Primary Examiner*—N. Le
*Assistant Examiner*—Hoai-An D. Nguyen
(74) *Attorney, Agent, or Firm*—Volpe and Koenig, P.C.

(57) ABSTRACT

The invention relates to an apparatus and a method for detecting a current direction in a PWM converter or an inverter having one or more upper and lower arms, each of which consists of a switching device with an anti-parallel diode. The voltage across the switching device presents a different value and a polarity that depend on the direction of the current flowing through the switching device, wherein the current direction is acquired by sampling this voltage in the period of the trigger signal being on. In a case of small current, this sampled voltage value is relatively large to the flowing current magnitude and is easy to be distinguished. Furthermore, this invention presents a method for obtaining the phase angle between the load current and the output voltage, and judging whether the output current is zero or includes DC component. As a result, this method presents high precision.

15 Claims, 7 Drawing Sheets

APPARATUS FOR DETECTING CURRENT DIRECTION IN BRIDGE CIRCUITS AND METHOD THEREOF

FIELD OF THE INVENTION

The present invention relates to an apparatus and a method for detecting a current direction in bridge circuits and more particularly to an apparatus and a method for detecting current direction in a PWM converter or an inverter.

BACKGROUND OF THE INVENTION

To an inverter or a converter, its load always presents a resistor-inductive character. As a result, a phase angle exists between a load current and an output voltage of the inverter or converter that varies with output frequency and load conditions. In many cases, a current direction is required to control the conduction or non-conduction of electronic switches in the inverter or converter. For example, the phase angle between the load current and the output voltage can be calculated from the current direction when a voltage phase is known. Besides, in dead time compensation, the current direction indicates the polarity of a distortion voltage caused by the dead time. Furthermore, the current direction can also be used to judge whether the output current is zero or includes a DC component.

Please refer to FIG. 1. FIG. 1 is a block diagram of a current direction detecting circuit in an inverter or a converter according to the prior art. As shown in FIG. 1, the current direction of the converter or converter is acquired by means of a HALL sensor 101. Other known devices, such as current transformers, can be similarly used to detect the current direction of the converter or converter. However, these devices are known to have the following drawbacks: a) a high cost; and b) the low precision caused by the magnetic hysteresis effect and offset due to temperature. FIG. 2 shows another typical circuit to get the current direction of the inverter or converter. In the figure, the current direction of the inverter or converter can be indicated according to the magnitude of a voltage across a resistor sensor 102. However, when the current is very small, especially around a zero crossing point of the current, the voltage across the resistor sensor 102 is small and therefore the current direction of the inverter or converter is hard to be detected by the resistor sensor 102 because of the effect of the noise and transient noise generated by PWM chopping. Consequently, to improve this problem, the resistor sensor 102 has to be selected a large value so that the power loss on the resistor sensor rises greatly. When a large power capacity of the inverter or converter is employed, the power loss of the resistor sensor will consume too much.

It is therefore attempted by the applicant to deal with the above situation encountered with the prior art.

SUMMARY OF THE INVENTION

It is therefore an object of the present invention to propose an apparatus and a method for detecting the current direction of an inverter or a converter with a high accuracy, high reliability, and low cost circuit.

It is another object of the present invention to propose an apparatus and a method for detecting a phase angle between an output voltage and an output current of an inverter or a converter.

It is a further object of the present invention to propose an apparatus and a method for indicating whether the output current is zero or includes a DC component.

In accordance with an aspect of the present invention, the current direction detecting apparatus having at least one phase bridges formed by a series connection of electronic switches, each of which is formed by a switching device in anti-parallel with a diode, a first node between the electronic switches electrically connected to a load, one end of the phase bridge electrically connected to one end of a first DC power supply, and the other end of the phase bridge electrically connected to the other end of the first DC power supply, including a diode having a cathode end electrically connected to the first node between the electronic switches, a resistor having one end electrically connected to an anode end of the diode to form a second node and the other end electrically connected to a second DC power supply, and a comparator having one of its input ends electrically connected to the anode of the diode and the other input end electrically connected to a predetermined voltage level, wherein a current direction of the first node is determined by an output signal of the comparator.

Preferably, the current direction detecting apparatus is applied to an inverter.

Preferably, the current direction detecting apparatus is applied to a converter.

Preferably, the current flows out the first node when the output signal of the comparator is at a high level and the current flows into the first node when the output signal of the comparator is at a low level.

Preferably, the current flows out the first node when the output signal of the comparator is at a low level and the current flows into the first node when the output signal of the comparator is at a high level.

Preferably, the current direction detecting apparatus further includes a sampler with its input end electrically connected to an output end of the comparator, and a sampling action is carried out during an interval that a gate driver signal of a lower switching device of the phase bridge is enabled.

Preferably, the current direction detecting apparatus further includes an isolator added between the output end of the comparator and the input end of the sampler.

Preferably, a sampling action is carried out during an interval that a gate driver signal of an upper switching device of the phase bridge is disenabled.

Preferably, the phase bridge includes an upper arm that is an upper switching device and a lower arm, which is a lower switching device.

Preferably, the current direction detecting apparatus further includes a decomposing device electrically connected to the anode of the diode for outputting a current direction signal by identifying a low level voltage of the voltage series at the second node in accordance with a gate driver signal of the phase bridges.

Certainly, a phase angle between an exciting voltage and an output current can be obtained if a voltage direction is known.

Certainly, the current direction detecting apparatus can detect whether the output current has a DC component.

In accordance with another aspect of the present invention, the current direction detecting apparatus having at least one phase bridges formed by a series connection of electronic switches, each of which is formed by a switching device in anti-parallel with a diode, a first node between the electronic switches electrically connected to a load, one end of the phase bridges electrically connected to one end of a first DC power supply, and the other end of the phase bridges electrically connected to the other end of the first DC power supply, including a diode having a cathode end electrically connected to a second DC power supply, a resistor having one end electrically connected to the first node between the electronic switches and the other end electrically connected to an anode end of the diode to form a second node, and a comparator having one of its input ends electrically connected to the second node and the other input end electrically connected to a predetermined voltage level, wherein a current direction of the first node is determined by an output signal of the comparator.

Preferably, the current direction detecting apparatus is applied to an inverter.

Preferably, the current direction detecting apparatus is applied to a converter.

Preferably, the current flows out the first node when the output signal of the comparator is at a high level and the current flows into the first node when the output signal of the comparator is at a low level.

Preferably, the current flows out the first node when the output signal of the comparator is at a low level and the current flows into the first node when the output signal of the comparator is at a high level.

Preferably, the current direction detecting apparatus further includes a sampler with its input end connected to an output end of the comparator, and the sampling action is carried out during an interval that a gate driver signal of the lower phase bridge switching device is enabled.

Preferably, the current direction detecting apparatus further includes an isolator added between the output end of the comparator and the input end of the sampler.

Preferably, a sampling action is carried out during an interval that a gate driver signal of an upper switching device of the phase bridge is disenabled.

Certainly, a phase angle between an exciting voltage and an output current can be obtained if a voltage direction is known.

Certainly, the current direction detecting apparatus can detect whether the output current has a DC component.

It is therefore further aspect of the present invention to propose a current direction detecting method applied to a phase bridge having a series connection of electronic switches, each of which is formed by a switching device in anti-parallel with a diode, a first node between the electronic switches electrically connected to a load, one end of the phase bridge electrically connected to one end of a first DC power supply, and the other end of the phase bridge electrically connected to the other end of the first DC power supply, including the steps of providing a diode having a cathode end electrically connected to the first node between the electronic switches, and providing a resistor having one end electrically connected to an anode end of the diode to form a second node and the other end electrically connected to a second DC power supply, wherein a current direction of the first node is determined by a magnitude of a signal at the second node.

It is therefore additional aspect of the present invention to propose a current direction detecting method applied to a phase bridge having a series connection of electronic switches, each of which is formed by a switching device in anti-parallel with a diode, a first node between the electric switches electrically connected to a load, one end of the phase bridges electrically connected to one end of a first DC power supply, and the other end of the phase bridges electrically connected to the other end of the first DC power supply, including the steps of providing a diode having a cathode end electrically connected to a second DC power supply, and providing a resistor having one end electrically connected to the first node between the electronic switches and the other end electrically connected to an anode end of the diode to form a second node; wherein a current direction of the first node is determined by a magnitude of a signal at the second node.

Preferably, the current direction detecting method further includes the step of: obtaining a phase angle between an exciting voltage and an output current if a voltage direction is known.

Preferably, the current direction detecting method further including the step of detecting whether the output current has a DC component current or not.

The present invention may best be understood through the following description with reference to the accompanying drawings, in which:

DETAILED DESCRIPTION OF THE PREFERRED EMBODIMENT

Although this invention is susceptible to embodiments of many different forms, some preferred embodiments would be described and illustrated in detail hereinafter. The present disclosure exemplifies the principle of the invention and is not to be considered a limitation to the broader aspects of the invention to the particular embodiment as described.

Figure 1:
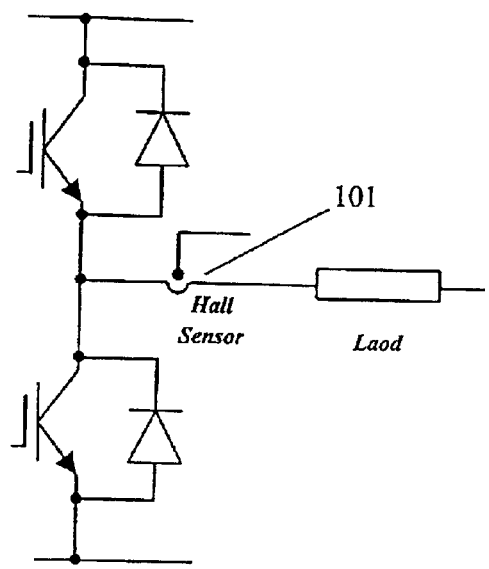
FIG. 1 is a block diagram of a current direction detecting circuit in an inverter or a converter according to the prior art.
Figure 2:
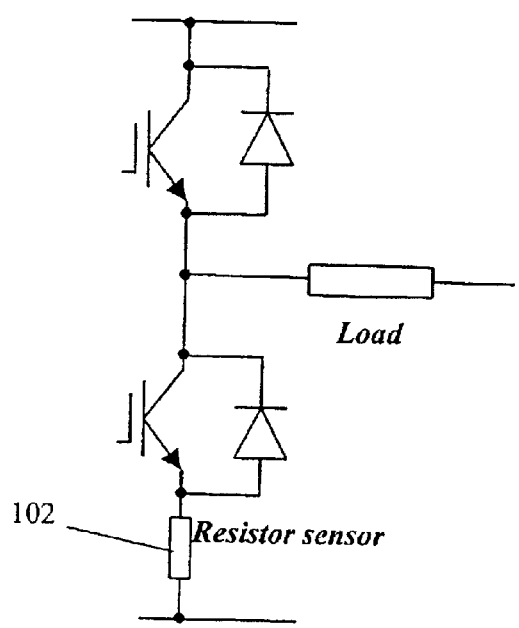
FIG. 2 is a block diagram of a current direction detecting circuit in an inverter or a converter according to the prior art.
Figure 3:
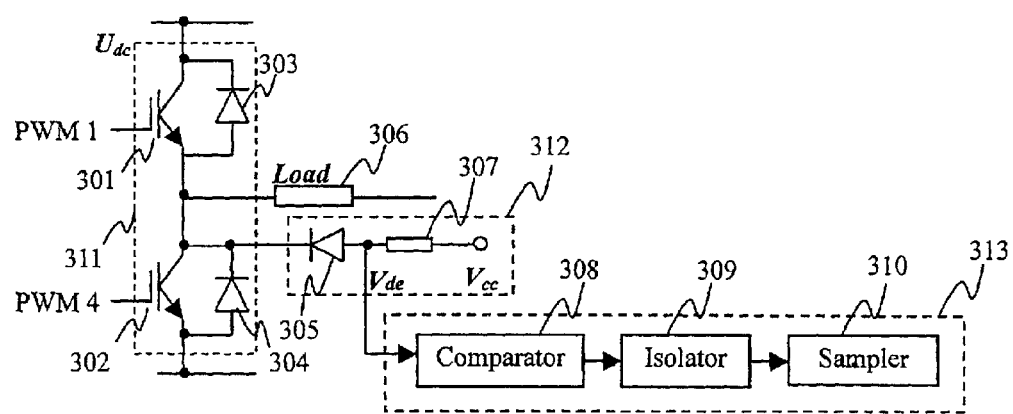
FIG. 3 is a block diagram of a first preferred embodiment according to the present invention.

Please refer to FIG. 3. FIG. 3 is a block diagram of a first preferred embodiment according to the present invention. The current direction detecting apparatus applied to an inverter or a converter includes at least one phase bridges 311, a diode 305, a resistor 307, a comparator 308, and a sampler 310. The phase bridges 311 is formed by a series connection of electronic switches 301 and 302, each of which is formed by a switching device 301 and 302 in anti-parallel with a diode 303 and 304 individually, wherein a first node between the electronic switches is electrically connected to a load 306. The first node of the series connection between the switching device 301 and the switching device 302 is defined the output terminal of the phase bridge 311.

One end of the phase bridge 311 is electrically connected to one end $U_{dc}$ of a first DC power supply, and the other end of the phase bridge is electrically connected to the other end of the first DC power supply. The diode 305 has a cathode end electrically connected to the first node between the electric switches 301 and 302. And, the resistor 307 has one end electrically connected to an anode end of the diode 305 to form a second node and the other end electrically connected to a second DC power supply $V_{cc}$, wherein a current direction of the first node is determined by a magnitude of a signal at the second node. A conducting current direction detecting device 312, which consists of the diode 305 and the resistor 307, is connected to the output terminal. The output of the circuit 312, which is labeled as $V_{de}$, presents voltage pulse series that have the same frequency as the PWM chopping frequency. And the high level voltage of the voltage pulse series $V_{de}$ is $V_{cc}$. Meanwhile, the low level voltage of the voltage pulse series $V_{de}$ is not of the same level, which depends on the load current direction.

Furthermore, the comparator 308 has one of its input ends electrically connected to the second node and the other input end electrically connected to a predetermined voltage level, wherein the current direction of the first node can be determined by an output signal of the comparator 308 so that the current flows out the first node when the output signal of the comparator 308 is at a high level and the current flows into the first node when the output signal of the comparator is at a low level, or that the current flows out the first node when the output signal of the comparator 308 is at a low level and the current flows into the first node when the output signal of the comparator is at a high level. It depends on the connection position of the predetermined at a positive end or a negative end of the comparator 308. In addition, the sampler 310 with its input end is electrically connected to an output end of the comparator 308, and a sampling action is carried out during an interval that a gate driver signal PWM4 of the lower switching device 302 of the phase bridge 311 is enabled. Preferably, the current direction detecting apparatus further includes an isolator 309 added between the output end of the comparator 308 and the input end of the sampler 310. Meanwhile, the sampling action is carried out during an interval that a gate driver signal PWM1 of the upper switching device 301 of the phase bridge is disenabled.

Preferably, the current direction detecting apparatus further includes a decomposing device 313 electrically connected to the second node for outputting a current direction signal by identifying a low level voltage of the voltage series at the second node in accordance with a gate driver signal of the phase bridge 311, wherein the decomposing device 313 can be the combination of the comparator 308, the isolator 309, and the sampler 310.

Figure 4:
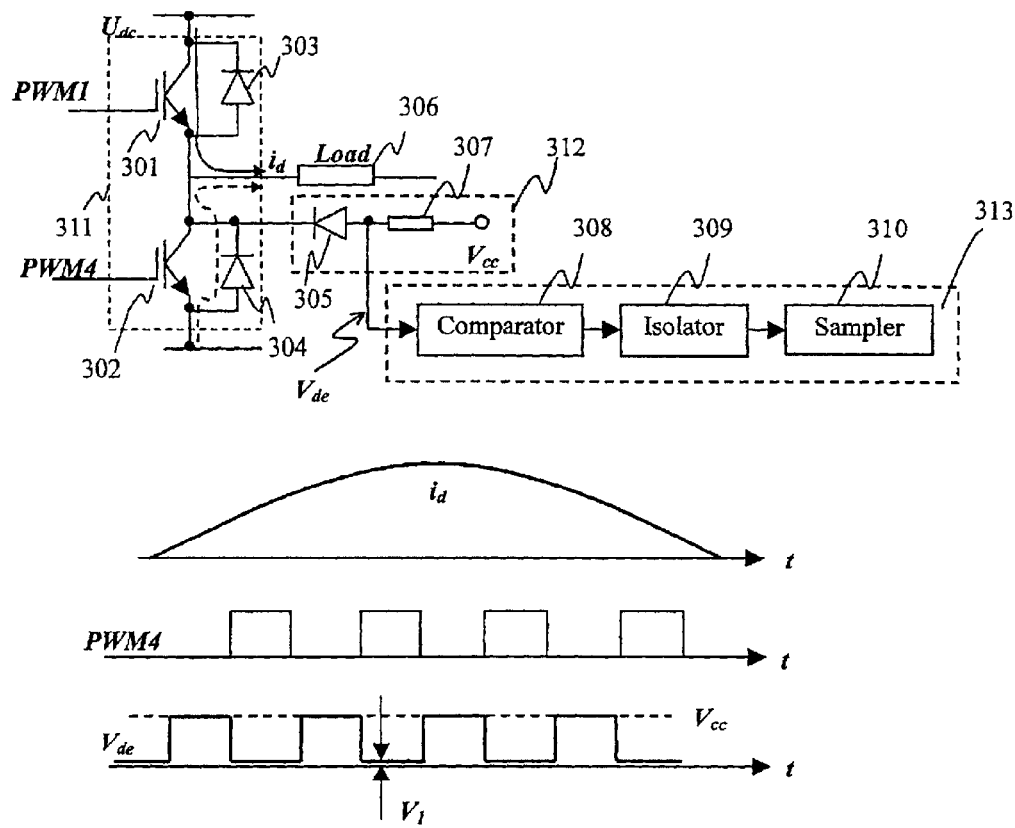
FIG. 4 is a graphic representation showing the operation of the first preferred embodiment when the load current flows out of the phase bridge.

Please refer to FIG. 4. FIG. 4 is a graphic representation showing the operation of the first preferred embodiment when the load current flows out of the phase bridge. When a load current $i_d$ is flowing out of the phase bridge 311, as is indicated by the solid arrow, the lower switching device 302 will not conduct even when its gate driver signal is at a high level. During this period, even if the upper switching device 301 has been turned off, however, due to the inductive load 306, the output current $i_d$ is continuous and flows through the diode 304. At this condition, the voltage pulse series $V_{de}$ equals to the subtraction between the conduction voltage of the diode 304 and the diode 305, and the magnitude of the voltage pulse series $V_{de}$ is labeled as $V_1$.

Figure 5:
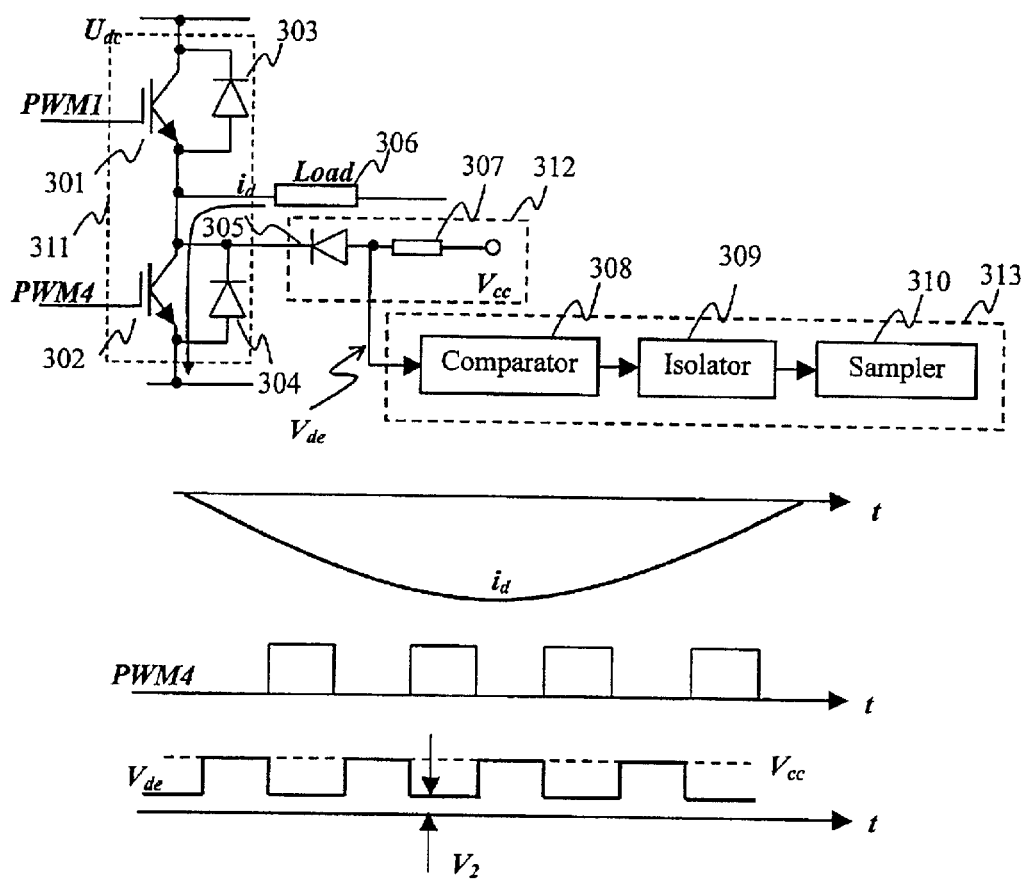
FIG. 5 is a graphic representation showing the operation of the first preferred embodiment when the load current flows into the phase bridge.

Please refer to FIG. 5. FIG. 5 is a graphic representation showing the operation of the first preferred embodiment when the load current flows into the phase bridge. When the load current $i_d$ is flowing into the phase bridge 311, as is indicated by the solid arrow, the lower switching device 302 get conduction when its gate driver signal PWM4 is at the high level. During this period, the voltage pulse series $V_{de}$ equals to the addition of the conduction voltage of the lower switching device 304 and the diode 305, and the magnitude of the voltage pulse series $V_{de}$ is labeled as $V_2$. Therefore, it is obvious that the difference between $V_1$ and $V_2$ is larger enough to be distinguished with each other. Thereby, the voltage pulse series $V_{de}$ includes the full current direction information.

Figure 6:
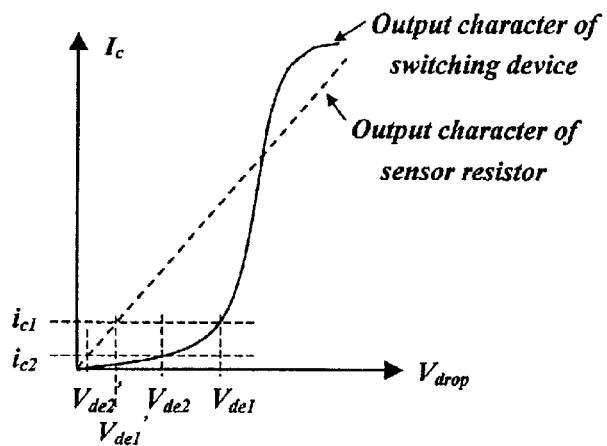
FIG. 6 illustrates the relationship between the current magnitude and the detected voltage series level that includes the current direction information according to the first preferred embodiment of the present invention.

FIG. 6 shows the output characteristic of a switching device. The bold dashed line represents the voltage across the sensor resistor. It can be seen that when the load current $i_{c1}$ is large, the voltage across each one of the switching device and the sensor resistor, $V_{de1}$ and $V_{de1}'$, is large and can be managed reliably. But when the load current $i_{c2}$ is small, especially around a zero crossing point, the voltage crossing the sensor resistor, $V_{de2}'$, is small and is hard to be separated from the noise caused by chopping transient. Meanwhile, the conduct voltage drop of the switching device, $V_{de2}$, does not decrease proportional to current decreasing, but in an exponential manner. So, when the load current is low, the conduct voltage still holds to be a relative large value. That is to say, $V_{de}$ holds a relative large value even under a low load current. So, the conducting current direction detecting device 312 is reliable and sensitive to indicate the current direction. As to the sampler 310 shown in FIGS. 3, 4, and 5, the sampler can be implemented by a microprocessor or a controller.

Figure 7:
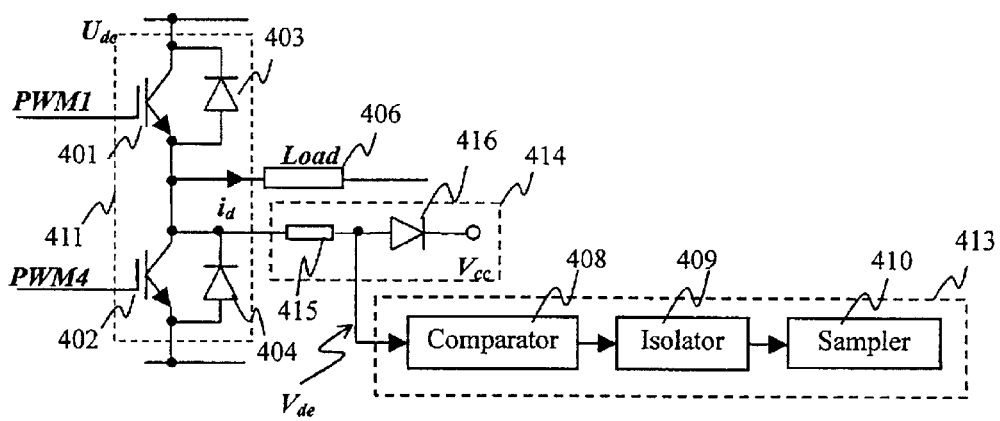
FIG. 7 is a block diagram of a second preferred embodiment according to the present invention.
Figure 8:
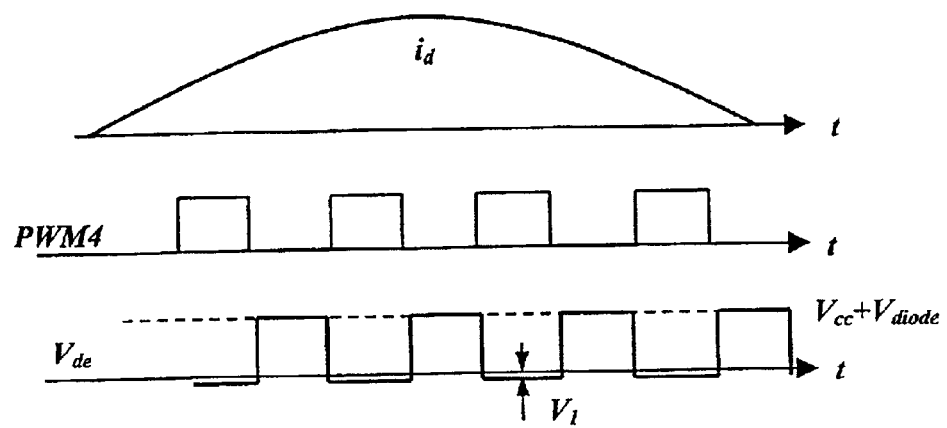
FIG. 8 is a graphic representation showing the operation of the second preferred embodiment when the load current flows out of the phase bridge.
Figure 9:
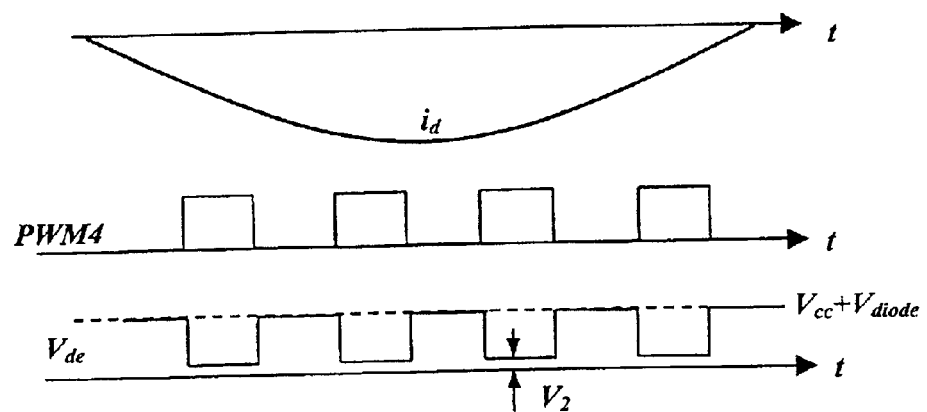
FIG. 9 is a graphic representation showing the operation of the second preferred embodiment when the load current flows into the phase bridge.

FIG. 7 is a block diagram of a second preferred embodiment according to the present invention. As shown in FIG. 7, the conducting current direction detecting device 414 consists of a diode 415 and a resistor 416. Comparing to the first preferred embodiment, the diode 415 is in reverse direction and its connection position is exchanged with the resistor 416. FIGS. 8 and 9 illustrate the corresponding operation. In the figures, similar to the situation of the first preferred embodiment, the voltage pulse series $V_{de}$ present in the form of voltage series according to the gate driver signal PWM4 of the lower switching device 402. These voltage series have the same frequency as the PWM chopping frequency, with its high level voltage being the addition of $V_{cc}$ and the voltage drop of the diode 416 and the low level voltage being relative to the current direction. The other elements of the second preferred embodiment such as a switching device 401, a diode 403, a load 406, a comparator 408, an isolator 409, a sampler 410, and a decomposing device 413 have the same function with the first preferred embodiment.

Please refer to FIG. 8, when the load current flows out of the phase bridge 411, during the period of the gate driver signal of the switching device 402 being high, the voltage pulse series $V_{de}$ present a negative low level which equals to the voltage drop of the diode 404. While in FIG. 9, the load current flows into the phase bridge 411, and during the period of the gate driver signal of switching device 402 being high, the voltage pulse series $V_{de}$ present a positive low level which equals to the voltage drop of the switching device 402. As a result, the voltage pulse series $V_{de}$ includes the fall information of current direction.

By virtue of the above-described arrangement of the present invention, the current direction can be acquired by decomposing the voltage pulse series $V_{de}$. This can be done easily by comparing the voltage level of the voltage pulse series $V_{de}$ with a predetermined voltage level in accordance with the gate driver signals of the switching devices 301, 302 or the switching devices 401, 402. FIGS. 3 and 7 also show embodiments by decomposing devices 313 and 413. The decomposing device consists of a comparator, an isolator and a sampler. The sampler can be a photo-coupler. The comparator compares the voltage pulse series $V_{de}$ with a predetermined voltage level. The output of the comparator is isolated by the isolator and sent to the sampler. The sampler samples the voltage pulse series $V_{de}$, which has been modified by the comparator and the photo-coupler, and judge the status of it in correspond to the gate driver signal PWM1 of the upper switching device or the gate driver signal PWM4 of the lower switching device. It should be noted that the decomposing device, which employs a microcomputer, could be realized by means of digital or hardware circuits.

On the other hand, the present invention provides one approach to obtain a phase angle between an exciting voltage and an output current of the phase bridge if a voltage direction is known. In many cases, the phase of the exciting voltage applied to the phase bridge is clearly known in the controller. While the zero crossing point of the output current is acquired, the phase angle between the exciting voltage and the output current can be carried out.

Additionally, the present invention provides another approach to detect whether the output current has a DC component. By means of the present method, zero crossing points of the output current are acquired. If the output current includes a DC component, the intervals between the zero crossing points will not be the same. That is, the asymmetry of the current direction signal indicates the DC component in the output current.

Although the phase bridge is formed from IGBTs in each of the above-described embodiments, the present invention may also be applied to inverters or converters, which are implemented by field-effect transistors (FET) or gate turnoff thyristors or transistors. Even if a single phase of an inverter or converter is exemplified in the above-described embodiments, the present invention may similarly be applied to multi-phase inverters or converters.

Figure 10:
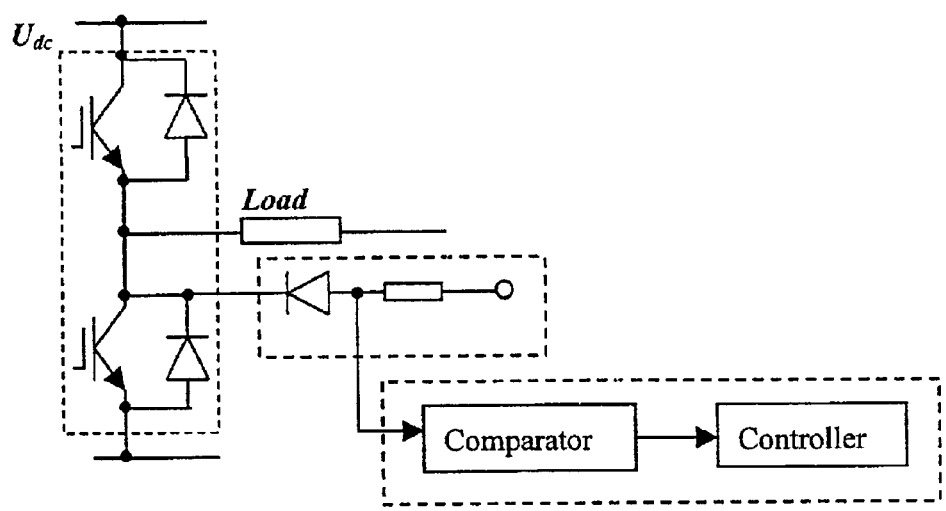
FIG. 10 is a block diagram of another preferred embodiment according to the present invention.

FIG. 10 shows another preferred embodiment according to the present invention. Comparing to the first and second preferred embodiments, there is a clear difference that there is not an isolator applied to the current direction detecting apparatus.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A current direction detecting apparatus having at least one phase bridge formed by a series connection of electronic switches, each of which is formed by a switching device in anti-parallel with a diode, a first node between said electronic switches electrically connected to a load, one end of said phase bridge electrically connected to one end of a first DC power supply, and the other end of said phase bridge electrically connected to the other end of said first DC power supply, comprising:

a diode having its cathode end electrically connected to said first node between said electronic switches;

a resistor having one end electrically connected to the anode end of said diode to form a second node and the other end electrically connected to a second DC power supply; and a comparator having one of its input ends electrically connected to said anode of said diode and the other input end electrically connected to a predetermined voltage level, wherein a current direction of said first node is determined by an output signal of said comparator.

2. The current direction detecting apparatus according to claim 1, said current direction detecting apparatus is applied to an inverter.

3. The current direction detecting apparatus according to claim 1, said current direction detecting apparatus is applied to a converter.

4. The current direction detecting apparatus according to claim 1, wherein said current flows out said first node when said output signal of said comparator is at a high level and said current flows into said first node when said output signal of said comparator is at a low level.

5. The current direction detecting apparatus according to claim 1, wherein said current flows out said first node when said output signal of said comparator is at a low level and said current flows into said first node when said output signal of said comparator is at a high level.

6. The current direction detecting apparatus according to claim 4 or 5, wherein said current direction detecting apparatus further comprises a sampler with its input end electrically connected to an output end of said comparator, and a sampling action is carried out during an interval that a gate driver signal of a lower switching device of said phase bridge is enabled.

7. The current direction detecting apparatus according to claim 6, wherein said current direction detecting apparatus further comprises an isolator added between said output terminal end of said comparator and said input end of said sampler.

8. The current direction detecting apparatus according to claim 6, wherein a sampling action is carried out during an interval that a gate driver signal of an upper switching device of said phase bridge is disenabled.

9. The current direction detecting apparatus according to claim 1, wherein said phase bridge comprises an upper arm which is an upper switching device and a lower arm which is a lower switching device.

10. The current direction detecting apparatus according to claim 9, wherein said current direction detecting apparatus further comprises a decomposing device electrically connected to said anode of said diode for outputting a current direction signal by identifying a low level voltage of said voltage series at said second node in accordance with a gate driver signal of said phase bridges.

11. The current direction detecting apparatus according to claim 1, wherein a phase angle between an exciting voltage and an output current is obtained if a voltage direction is known.

12. The current direction detecting apparatus according to claim 1, wherein said current direction detecting apparatus detects whether said output current has a DC component.

13. A current direction detecting method to applied to a phase bridge having a series connection of electronic switches, each of which is formed by a switching device in anti-parallel with a diode, first node between said electronic switches electrically connected to a load, one end of said phase bridge electrically connected to one end of a first DC power supply, and the other end of said phase bridge electrically connected to the other end of said first DC power supply, comprising the steps of:

provibing a diode having its cathode end electrically connected to said first node between said electronic switches; and providing a resistor having one end electrically connected to the anode end of said diode to form a second node and the other end electrically connected to a second DC power supply, wherein a current direction of said first node is determined by a magnitude of a signal at said second node.

14. The current direction detecting method according to claim 13, wherein said current direction detecting method further comprises the step of: obtaining a phase angle between an exciting voltage and an output current if a voltage direction is known.

15. The current direction detecting method according to claim 13, wherein said current direction detecting method further comprises the step of: detecting whether said output current has a DC component current or not.

* * * * *